(12) United States Patent
Cherry et al.

(10) Patent No.: US 6,693,489 B2
(45) Date of Patent: Feb. 17, 2004

(54) LEVEL-SHIFT CIRCUITS AND RELATED METHODS

(75) Inventors: Edward Moore Cherry, Marysville (AU); Christopher G. Martinez, Portland, OR (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 0 days.

(21) Appl. No.: 09/917,057

(22) Filed: Jul. 27, 2001

(65) Prior Publication Data

US 2003/0020542 A1 Jan. 30, 2003

(51) Int. Cl.[7] .................................................. H03F 3/45
(52) U.S. Cl. ........................ 330/252; 330/258; 330/259
(58) Field of Search ................................ 330/252, 258, 330/259

(56) References Cited

U.S. PATENT DOCUMENTS 5,652,545 A * 7/1997 Miyashita et al. .......... 330/253
5,742,183 A * 4/1998 Kuroda ......................... 326/68
5,939,922 A * 8/1999 Umeda ........................ 327/333
6,429,700 B1 * 8/2002 Yang .......................... 330/258

* cited by examiner

Primary Examiner—Khanh Van Nguyen
(74) Attorney, Agent, or Firm—Blakely, Sokoloff, Taylor & Zafman LLP

(57) ABSTRACT

A level shift circuit and method for level shifting the common-mode voltage of a power-supply-referenced circuit to the common-mode voltage of a ground-referenced circuit. The level shift circuit and method entails performing a common-mode level shifting of input complementary signals derived from the power-supply-referenced circuit to produce output complementary signals for the ground-referenced circuit. Because the level shifting is performed in a common manner (i.e. the level shift or voltage drop is common to both complementary signals), pulse-width distortion is substantially reduced if not eliminated. The level shift circuit includes a voltage drop device common to both sides of a differential pair to produce the desired level shift of the output complementary signals. Yet another embodiment relates to a multi-stage level shift circuit and method for level shifting in steps an input common-mode voltage to an output common-mode voltage.

15 Claims, 3 Drawing Sheets

LEVEL-SHIFT CIRCUITS AND RELATED METHODS

FIELD OF THE INVENTION

This invention relates generally to level-shift circuits, and in particular, to level-shift circuits and related methods that perform common-mode level shifting of the common-mode voltage of a power-supply-referenced circuit to the common-mode voltage of a ground-referenced circuit, and for distributing the overall voltage shift among a plurality of level-shifting stages.

BACKGROUND OF THE INVENTION

In many applications, there is a need to level shift the complementary signals of a power-supply-referenced circuit where the signals are referenced from the power supply voltage Vcc to the complementary signals of a ground-referenced circuit where the signals are referenced from ground potential. For example, the power-supply-referenced circuit may be a data latch or multiplexer where the complementary output signals swing between 3.3 Volts and 3.1 Volts and the ground-referenced circuit may be a laser driver or low voltage differential signaling (LVDS) circuit where the complementary input signals swing between 1.5 Volts and 1.3 Volts. Generally, the level shifting is referred to with reference to the common-mode voltage, i.e. the average of the complementary signal levels. In the above example, the level shifting is from a common-mode voltage of 3.2 Volts (average of 3.3 Volts and 3.1 Volts) of the power-supply-referenced circuit to the common-mode voltage of 1.4 Volts (average of 1.5 Volts and 1.3 Volts) of the ground-referenced circuit. Typically, a level-shift circuit is used to perform the level shifting of the common-mode voltage of the power-supply-referenced circuit to the common-mode voltage of the ground-referenced circuit.

FIG. 1A illustrates a schematic diagram of an exemplary representation of a level shift circuit 100 interfacing a power-supply-referenced circuit 102 and a ground-referenced circuit 104. In this example, the level shift circuit 100 is represented as two variable batteries 106 and 108 respectively coupling the respective outputs of the power-supply-referenced circuit 102 to the inputs of the ground-referenced circuit 102. The ground-referenced circuit 104 may include an input differential pair of bipolar transistors Q15 and Q16 having bases respectively coupled to the variable batteries 108 and 106 of the level shift circuit 100 and emitters connected in common to a current source represented as bipolar transistor Q17.

The power-supply-referenced circuit 102 may include a pair of differential bipolar transistors Q11 and Q12 having bases configured to receive complementary signals, emitters electrically connected in common to a tail current source I11, and collectors respectively connected to collector resistors R11 and R12. The power-supply-referenced circuit 102 further consists of emitter-follower output bipolar transistors Q13 and Q14 having bases respectively connected to the collectors of transistors Q12 and Q11, emitters respectively connected to current sources I12 and I13, and collectors connected to the power supply rail, which is connected to the source resistors R11 and R12 as well. The emitters of the emitter-follower output transistors Q13 and Q14 serve to produce the complementary output signals of the power-supply-referenced circuit 102, and are respectively coupled to the variable batteries 106 and 108 of the level shift circuit 100.

The common-mode voltage of the power-supply-referenced circuit 102 may be at a different voltage level than the common-mode voltage of the ground-referenced circuit 104. In addition, the common-mode voltage of the power-supply-referenced circuit 104 varies with changes in the power supply voltage Vcc, with changes in temperature, and with changes in the production process. The common-mode voltage of the ground-referenced circuit 104 should be substantially independent to variations of the power supply voltage Vcc, temperature and process. Thus, the level shift circuit 100 performs two functions: (1) to provide the necessary voltage shift of the common-mode voltage of the power-supply-referenced circuit 102 to the common-mode voltage of the ground-referenced circuit 104 and (2) to isolate variations in the power supply voltage Vcc, temperature, and process from the common-mode voltage of the ground-referenced circuit 104. Thus, the level shift circuit is represented as variable batteries 106 and 108 to perform such functions.

FIG. 1B illustrates a schematic diagram of a prior art level shift circuit 150 for shifting the common-mode voltage of the power-supply-referenced circuit 102 (as previously described) to the common-mode voltage of the ground-referenced circuit 104 (as previously described). The prior art level shift circuit 150 consists of resistors R13 and R14 respectively coupling the outputs of the power-supply-referenced circuit 102 to the inputs of the ground-referenced circuit 104, and variable current sources I14 and I15 coupled respectively to the resistors R13 and R14 and to ground potential. The respective voltage drops across the resistors R13 and R14 are formed by the currents induced through them by the respective current sources I14 and I15. The voltage drops across the resistors R13 and R14 provide the appropriate level shift between the power-supply-referenced circuit 102 and the ground-referenced circuit 104. In addition, the current sources I14 and I15 are made variable to absorb any variations in the quiescent voltage difference between the two circuits 102 and 104. In addition, capacitors C11 and C12 may be coupled across respective resistors R13 and R14 to reduce the adverse effects of the resistors R13 and R14 on the frequency response of the circuit.

A drawback of the prior art level shift circuit 150 stems from the level shifting of the complementary signals being performed independently of each other. In this case, the resistor R13 and current source I14 perform the level shift of one of the complementary signals independently of the level shift performed by resistor R14 and current source I15 on the other complementary signal. In order to avoid the formation of pulse-width distortion of the signals at the ground-referenced section, it is desirable for the level shift on each of the complementary signals to be substantially the same. However, it is difficult to provide accurately-matched equal resistors R13 and R14 and current sources I14 and I15 in order to achieve substantially the same level shift for each signal. Another drawback is the adverse effects of the resistors R13 and R14 on the frequency response of the circuit, even though capacitors C11 and C12 are employed to reduce these adverse effects; desirably R13 and R14 should be small. Yet another drawback of R13 and R14 and of I14 and I15 is that they consume a relatively large amount of power, which is undesirable; the is especially the case when R13 and R14 are small, as is desirable.

Thus, there is a need for level shift circuits and related methods that overcome the above-mentioned drawbacks of the prior art level shift circuit. Such a need and others are met with the level shift circuits and related methods in accordance with the invention.

SUMMARY OF THE INVENTION

A first aspect of the invention relates to a method of level shifting the common-mode output voltage of a power-supply-referenced circuit to the common-mode input voltage of a ground-referenced circuit. The method entails performing a common (as distinct from independent and separate) level shifting of complementary signals derived from the power-supply-referenced circuit to produce the complementary signals for the ground-referenced circuit. Because the level shifting is performed in a common manner (i.e. the level shift or voltage drop is common to both complementary signals), pulse-width distortion is substantially reduced if not eliminated. A specific example of common-mode level shifting entails applying input complementary signals to bases of a differential pair of bipolar transistors, wherein the output complementary signals are derived from the respective collectors of the differential transistor pair, and using a voltage drop device common to both sides of the differential transistor pair to level shift the output complementary signals.

The common-mode level shifting method may also entail providing feedback control for controlling the amount of level shifting. Such feedback control may entail generating a feedback voltage related to the common-mode voltage of the shifted output complementary signals and adjusting the voltage drop device until the feedback voltage is substantially the same as an external reference voltage. Adjusting the voltage drop device may entail varying a tail current of the differential pair of bipolar transistors inversely with the difference between the reference voltage and the feedback voltage. In addition, generating the feedback voltage may entail applying the shifted output complementary signals to a differential pair of bipolar transistors of a following level shifting stage and generating the feedback voltage from the tail voltage of the differential pair of bipolar transistors of the following stage.

Another aspect of the invention relates to a level shift circuit that implements the common-mode level shifting. The level shift circuit comprises a differential pair of bipolar transistors having bases to respectively receive input complementary signals, emitters coupled in common to a first (tail) current source, and collectors respectively coupled to first and second collector resistors. In addition, the level shift circuit comprises a pair of emitter-follower output bipolar transistors having bases respectively coupled to the collectors of the differential pair of bipolar transistors, emitters respectively coupled to second and third current sources, and collectors coupled to the power supply rail, wherein the output complementary signals are respectively produced at the emitters of the emitter-follower output bipolar transistors. To generate the common-mode level shift, the level shift circuit includes a voltage drop device connected between the power supply rail and the collector resistive elements, whereby the voltage drop device produces a voltage drop related to the desired level shift of the output complementary signals.

In a more specific embodiment of the level shift circuit, the voltage drop device comprises a current source, and the tail current source comprises an open-collector-output operational amplifier. The operational amplifier varies the tail current inversely with the difference between an external reference voltage applied to the positive terminal of the operational amplifier and a feedback voltage applied to the negative terminal of the operational amplifier. The feedback voltage is related to the common-mode voltage of the shifted complementary output signals.

Yet another aspect of the invention relates to a multi-stage level shift circuit and method of level shifting in steps an input common-mode voltage of input complementary signals to the output common-mode voltage of output complementary signals. The level shift circuit method comprises performing a plurality of common-mode level shifts in cascade to produce the output complementary signals from input complementary signals. Each level shift is performed by a common-mode level shifting circuit as described above. In addition, the multi-stage level shift circuit may include a reference voltage circuit for generating a plurality of reference voltages for controlling the amount of respective level shifts for the level shifting stages.

The level shift circuit may be implemented with the n-MOS, p-MOS or CMOS technologies as well as bipolar technology. Other aspects, features and techniques of the invention will become apparent to one skilled in the relevant art in view of the following detailed description of the invention.

DETAILED DESCRIPTION OF THE INVENTION

Figure 1A:
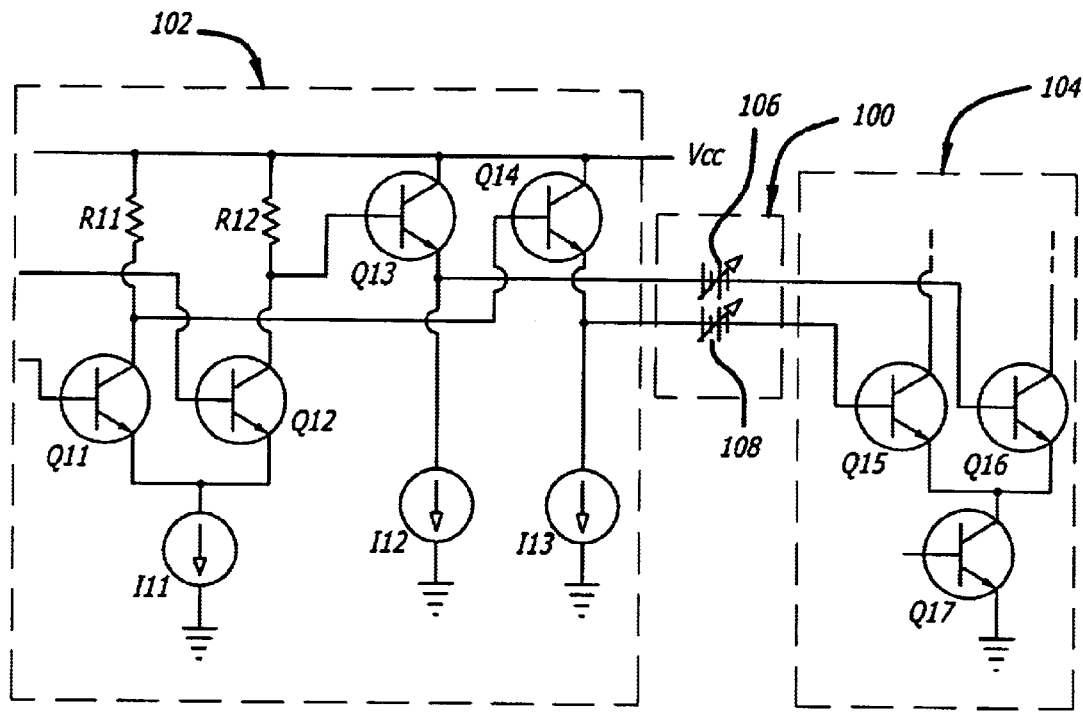
FIG. 1A illustrates a schematic diagram of an exemplary representation of a level shift circuit interfacing a power-supply-referenced circuit to a ground-referenced circuit.
Figure 1B:
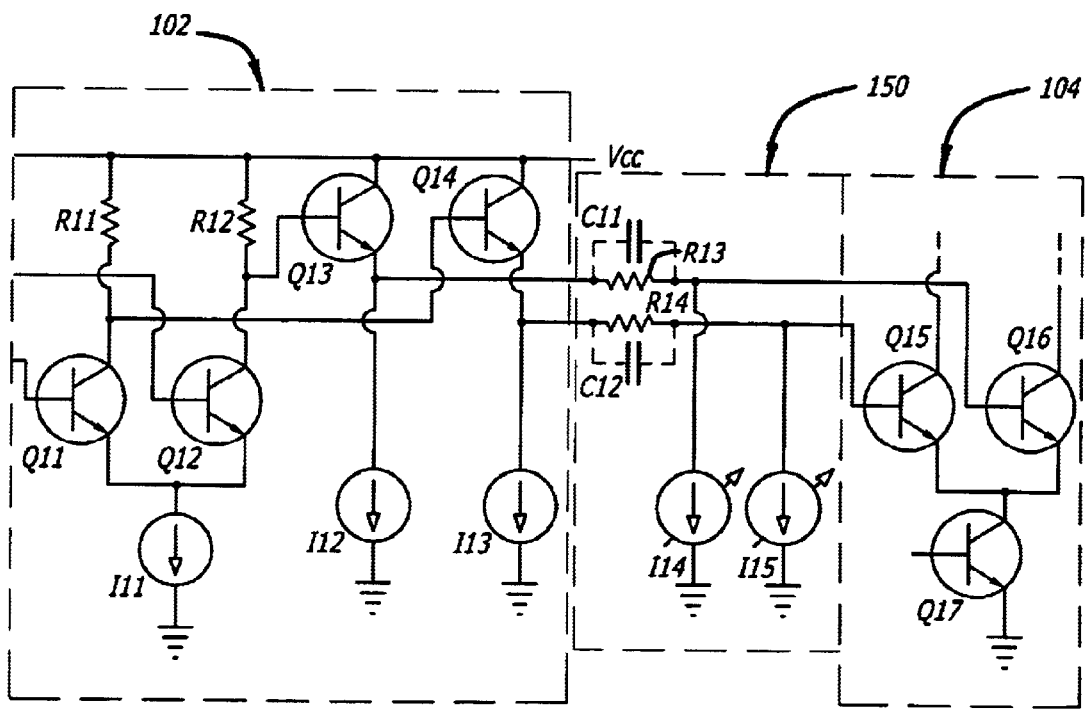
FIG. 1B illustrates a schematic diagram of a prior art level shift circuit for shifting the common-mode voltage of a power-supply-referenced circuit to the common-mode voltage of a ground-referenced circuit.
Figure 2:
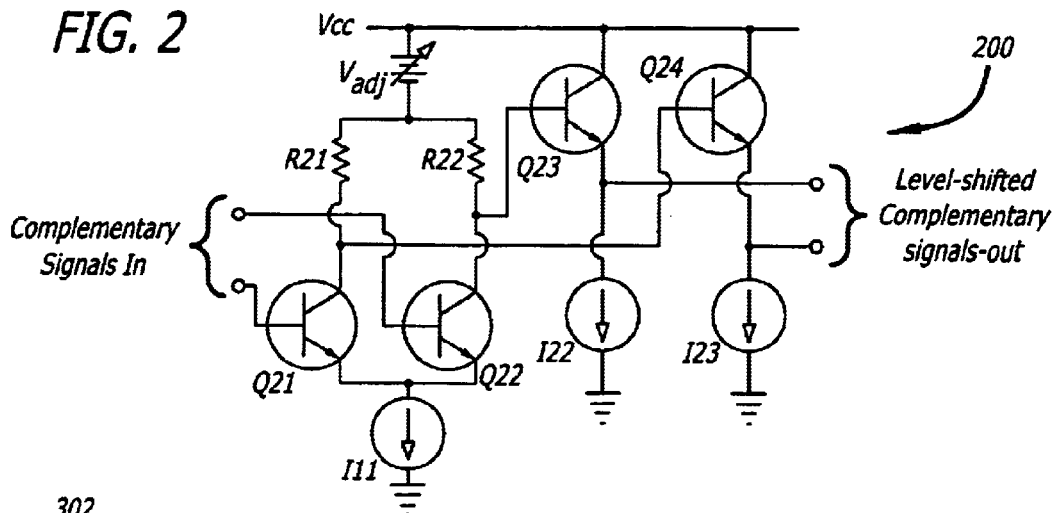
FIG. 2 illustrates a schematic diagram of an exemplary level shift circuit in accordance with the invention.

FIG. 2 illustrates a schematic diagram of an exemplary level shift circuit 200 in accordance with the invention. The level shift circuit 200 comprises an input differential pair of bipolar transistors Q21 and Q22 having bases to respectively receive complementary signals to be level shifted, emitters connected in common to a tail current source I11, and collectors respectively connected to collector resistors R21 and R22. The level shift circuit 200 further comprises emitter-follower output bipolar transistors Q23 and Q24 having bases respectively connected to the collectors of transistors Q22 and Q21, emitters respectively connected to current sources I22 and I23, and collectors coupled to the power supply rail. The shifted output complementary signals of the level shift circuit 200 are taken off the respective emitters of transistors Q23 and Q24.

In order to provide a level shift of the common-mode voltage of the input signals to the common-mode voltage of the output signals, the exemplary level shift circuit 200 includes a variable voltage drop device $V_{adj}$ represented as a variable battery. The variable voltage drop device $V_{adj}$ reduces the supply voltage applied to the differential transistor pair Q21 and Q22 by an amount of $V_{adj}$. This shifts the input signals by an amount which is related to $V_{adj}$ to produce the shifted output signals. Since the variable voltage drop device $V_{adj}$ is common to both sides of the differential transistor pair Q21 and Q22, the level shifting is common to both complementary signals. Thus, the level shifting of the complementary signals is performed in a common-mode manner, and consequently, eliminates or reduces pulse width distortion that typically results from unequal level shifting of the complementary signals. The maximum amount of downward level shifting performed by the level shift circuit 200 is approximately one base-emitter voltage drop $V_{be}$. The circuit can also produce an upwards level shift. Although the variable voltage drop device $V_{adj}$ is represented as a variable battery, it shall be understood that the variable voltage drop device $V_{adj}$ can be any device that causes a desired level shift to both complementary signals.

Figure 3:
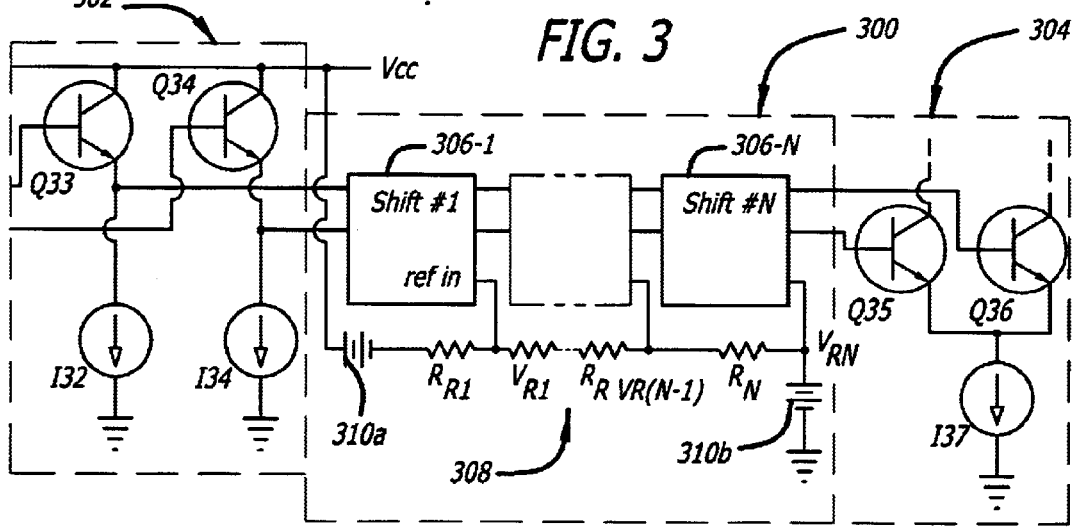
FIG. 3 illustrates a schematic/block diagram of an exemplary multi-stage level shift circuit in accordance with the invention.

FIG. 3 illustrates a schematic/block diagram of an exemplary multi-stage level shift circuit 300 in accordance with the invention. The multi-stage level shift circuit 300 shifts the common-mode voltage of a power-supply-referenced circuit 302 to the common-mode voltage of a ground-referenced circuit 304. As previously discussed, the output of the power-supply-referenced circuit 302 may include emitter-follower output transistors Q33 and Q34 respectively coupled to current sources I32 and I34. Also, the outputs of the power-supply-referenced circuit 302 are taken off the respective emitters of transistors Q33 and Q34. The ground-referenced circuit 304 may include an input circuit having differential transistor pair Q35 and Q36 with bases to receive the level-shifted complementary signals and emitters connected in common to a current source I37.

In this case, the exemplary level shifting circuit 300 comprises a plurality of level shifting stages 306-1 through 306-N that perform the desired total level shift of the common-mode voltage of the power-supply-referenced circuit 302 to the appropriate common-mode voltage of the ground-referenced circuit 304. One or more of the level shifting stages 306-1 through 306-N may be of the type that perform common-mode level shifting, such as the level shift circuit 200 shown in FIG. 2. The level shifting stages 306-1 through 306-N respectively shift the common-mode voltage in discrete steps. The total level shift may be distributed equally or unequally between the level shifting stages 306-1 through 306-N.

The exemplary level shift circuit 300 may further comprise a reference voltage circuit 308 that generates reference voltages $V_{R1}$ through $V_{RN}$ that set the respective common-mode voltages at the output of respective level shifting stages 306-1 through 306-N. In other words, the progression of the level shifting performed by the level shifting stages 306-1 through 306-N correlates with the progression of the reference voltages from $V_{R1}$ to $V_{RN}$. As an example, if the common-mode output voltage of the power-supply referenced circuit is ($V_{cc}$−0.9V) and if the common-mode input voltage of the ground-referenced circuit 304 is required to be 1.5V, and if the total shift is to be accomplished in three stages, then the common-mode output voltages of shift cells 1–3 might be (2/3$V_{cc}$−0.1V), (1/3$V_{cc}$+0.7V) and 1.5V. For situation in which $V_{cc}$=3.0V, these common-mode voltages correspond to 1.9V, 1.7V and 1.5V, with a downwards shift of 0.2V per stage. However, if $V_{cc}$=3.6V, they correspond to 2.3V, 1.9V and 1.5V, and a downwards shift of 0.4V per stage. In these examples, the level shift is uniformly distributed between the stages, but this is not essential to the invention, and may not always be desirable. As will be shown in a following embodiment, each level shifting stage uses the reference voltage to control the amount of level shifting.

In the exemplary embodiment, the voltage reference circuit 308 is configured as a voltage divider comprising a plurality of series-connected resistors $R_{R1}$ through $R_{RN}$ with voltage offsets 310a–b represented as batteries on either side of the voltage divider. The voltage reference circuit 308 may be connected to the power supply rail voltage Vcc or some other voltage source.

Figure 4:
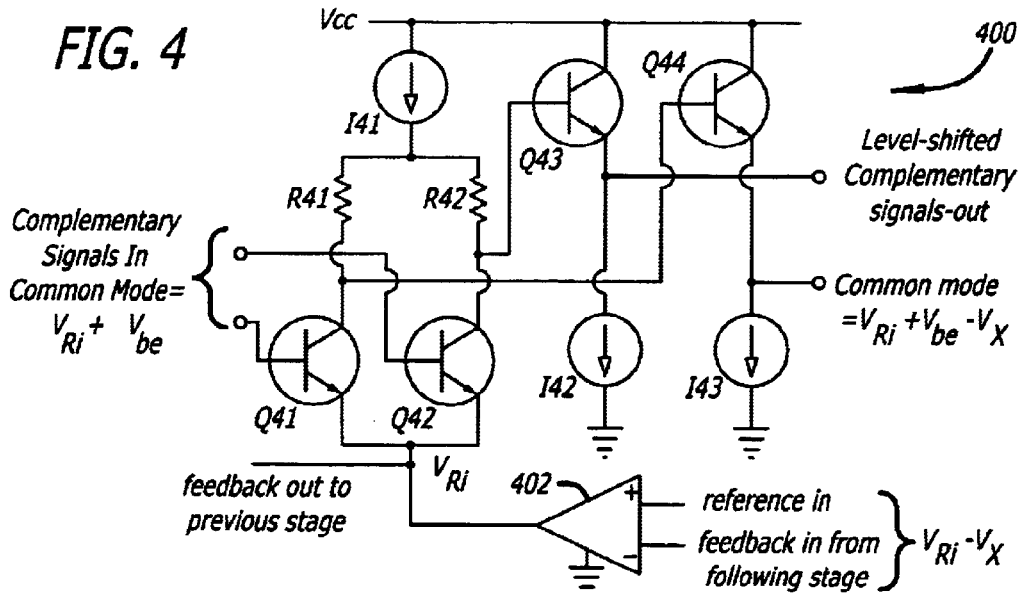
FIG. 4 illustrates a schematic diagram of another exemplary level shift circuit that can be used as an individual stage of a multi-stage level shift circuit in accordance with the invention.

FIG. 4 illustrates a schematic diagram of another exemplary level shift circuit 400 that can be used as an individual stage of a multi-stage level shift circuit in accordance with the invention. The level shift circuit 400 comprises an input differential pair of bipolar transistors Q41 and Q42 having bases to respectively receive complementary signals to be level shifted and collectors respectively connected to collector resistors R41 and R42. The level shift circuit 400 further comprises output emitter-follower bipolar transistors Q43 and Q44 having bases respectively connected to the collectors of transistors Q42 and Q41, emitters respectively connected to current sources I42 and I43, and collectors coupled to the power supply rail. The shifted outputs of the level shift circuit 400 are taken off the respective emitters of transistors Q43 and Q44.

In order to provide a controlled level shift, the exemplary level shift circuit 400 further comprises an open-collector-output operational amplifier 402 having an output coupled to the emitters of the differential transistor pair Q41 and Q42, a positive terminal for receiving a reference voltage from a reference voltage circuit, and a negative terminal for receiving as feedback the tail voltage of differential pair Q41 and Q42 of the following stage. If the exemplary level shift circuit 400 is not the first stage of a multi-stage level shift circuit, the tail voltage of differential pair Q41 and Q42 is coupled to the negative terminal of the open-collector-output operational amplifier of the previous stage. If the exemplary level shift circuit 400 is the first stage of a multi-stage level shift circuit, the tail voltage of differential pair Q41 and Q42 may be coupled to a reference voltage circuit in order to generate the respective reference voltages for the multi-stage level shift circuit, as discussed in further detail below. In addition, a current source I41 is provided between the power supply rail and the collector resistors R41 and R42 to generate the necessary voltage drop to provide the desired level shift.

In operation, the exemplary level shift circuit 400 controls the amount of level shifting by feeding back the output of the level shift circuit 400 to the negative terminal of the open-collector-output operation amplifier 402 by way of the base-emitter drop of the input differential transistor pair of the following stage. The open-collector-output operational amplifier 402 functions as a voltage-controlled current source that causes the tail current of the input differential pair Q41 and Q42 to vary inversely with the difference between the reference voltage and the tail voltage of the following stage. Thus, if the tail voltage of the next stage is below the reference voltage (meaning that the output of the level shift circuit is below the appropriate level), the tail current of the input differential pair Q41 and Q42 is decreased, to increase the collector voltages of the differential transistor pair Q41 and Q42, thereby increasing the output voltages to cause the tail voltage of the following stage to substantially equal the reference voltage. The opposite effect occurs if the tail voltage of the following stage is above the reference voltage. In this manner, the feedback loop maintains the tail voltage substantially at the reference voltage.

In the above manner, the reference voltage circuit can be designed to generate reference voltages for each of the level shifting stage in order to set the various level shifts for the stages. For instance, a reference voltage circuit can be designed to cause each level shifting stage in a multi-stage level shifting circuit to level shift by a variable amount $V_x$, up to a maximum downwards shift of approximately one base-emitter voltage drop for each level shifting stage. Referring to FIG. 4 again, the tail voltage for the differential pair Q41 and Q42 can be set by the previous stage to be at $V_{Ri}$. Thus, the common-mode voltage for the input signals of the level shift circuit 400 is at $(V_{Ri}+V_{be})$, one base-emitter voltage $V_{be}$ above the tail voltage $V_{Ri}$. The reference voltage for level shift circuit 400 is set at $V_{R(i+1)}=(V_{Ri}-V_x)$, which sets the tail voltage of the following stage also at $(V_{Ri}-V_x)$. Thus, the common-mode voltage of the output of the level shift stage 400 is $(V_{Ri}+V_{be}-V_x)$, one base-emitter voltage $V_{be}$ above the tail voltage $(V_{Ri}-V_x)$ of the following stage. Thus, the level shift circuit 400 has shifted the common-mode voltage by the desired amount $V_x$, due to the same $V_x$ voltage change progression of the reference voltage circuit.

Figure 5:
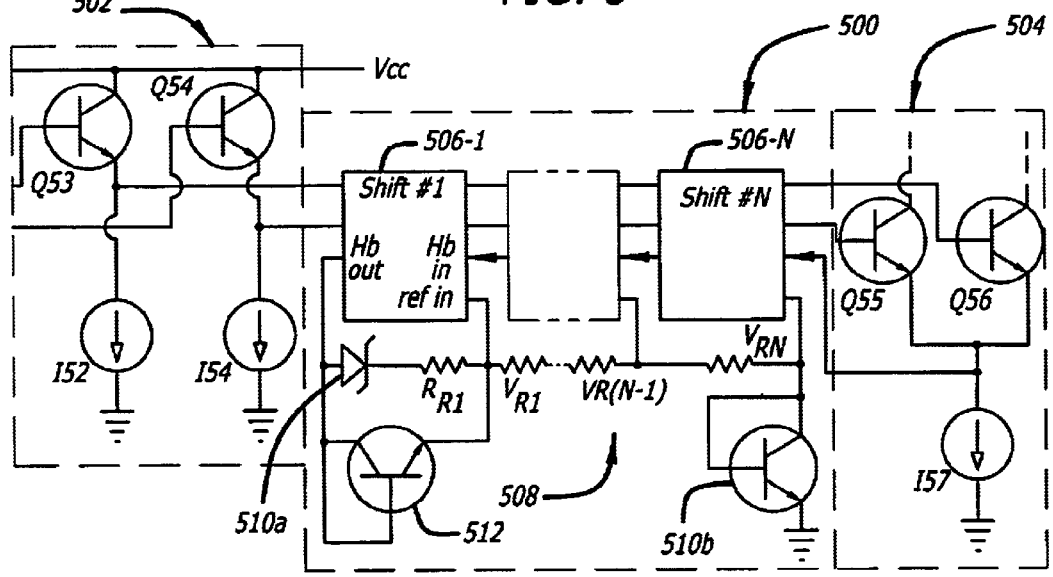
FIG. 5 illustrates a schematic/block diagram of another exemplary multi-stage level shift circuit in accordance with the invention.

FIG. 5 illustrates a schematic/block diagram of another exemplary multi-stage level shift circuit 500 in accordance with the invention. The multi-stage level shift circuit 500 shifts the common-mode voltage of a power-supply-referenced circuit 502 to the common-mode voltage of a ground-referenced circuit 504. As previously discussed, the output of the power-supply-referenced circuit 502 may include emitter-follower output transistors Q53 and Q54 respectively coupled to current sources I52 and I54. Also, the outputs of the power-supply-referenced circuit 502 are taken off the respective emitters of transistors Q53 and Q54. The ground-referenced circuit 504 may include an input circuit having a differential transistor pair Q55 and Q56 with bases to receive the level-shifted complementary signals and emitters connected in common to a current source I57.

The multi-stage level shift circuit 500 comprises a plurality of level shifting stages 506-1 through 506-N of the same type as level shift circuit 400 shown in FIG. 4. The multistage level shift circuit 500 further comprises a voltage reference circuit 508 to generate a plurality of reference voltages $V_{R1}$ to $V_{RN}$ to set the respective amounts of level shifting of the level shifting stages 506-1 through 506-N. In this case, the voltage reference circuit 508 comprises a voltage divider having a plurality of series-connected resistors $R_{R1}$ to $R_{RN}$, a voltage offset 510b in the form of a diode-connected transistor to set the tail voltage of the ground-referenced circuit 504 to approximately one base-emitter voltage drop $V_{be}$ above ground, and a voltage offset 510a in the form of a Schottky diode and a diode-connected transistor 512 coupled to the tail voltage of the first level shifting stage 506-1. The Schottky diode 510a provides a minimum level shift, for example 0.3 Volt, for the first level shifting stage 506-1 to prevent saturation of the differential transistor pair Q41 and Q42 and/or the current source I41 in the case of a relatively low $V_{CC}$ Voltage (See FIG. 4). The diode-connected transistor 512 restricts the maximum shift for the first level shifting stage 506-1 to one base-emitter voltage drop $V_{be}$, the maximum shift permitted in one stage.

Figure 6:
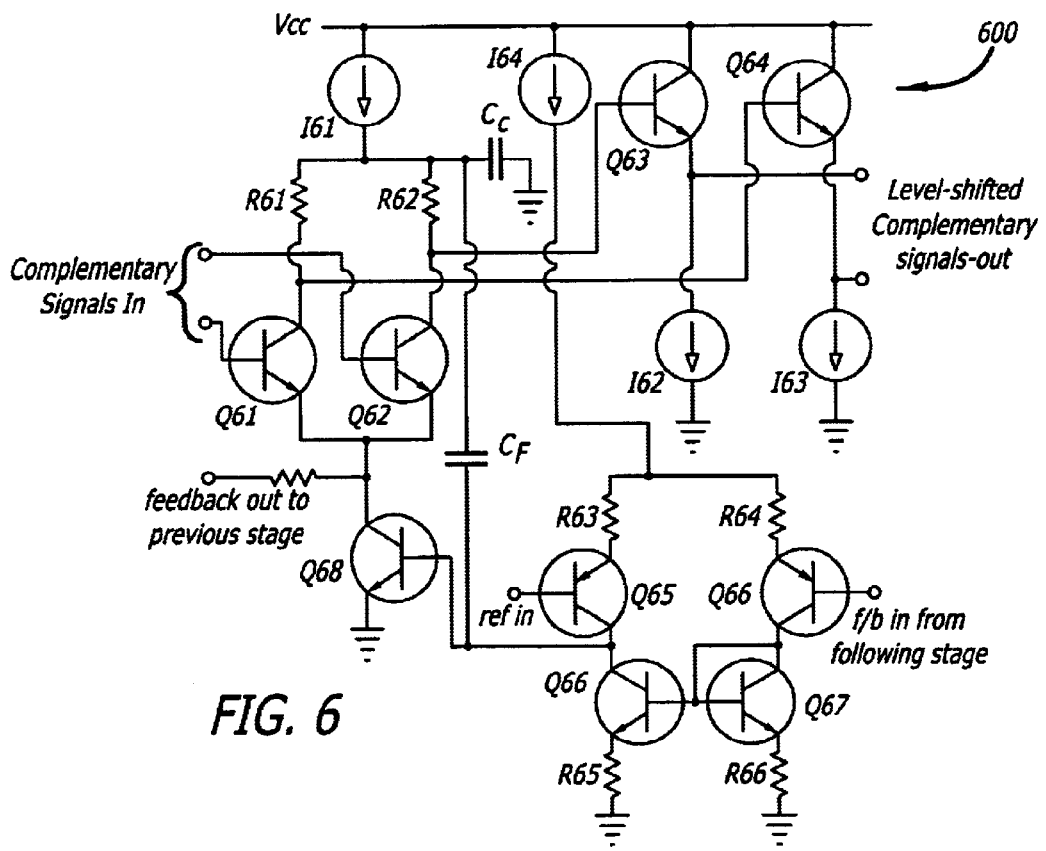
FIG. 6 illustrates a schematic diagram of yet another exemplary level shift circuit in accordance with the invention.

FIG. 6 illustrates a schematic diagram of an exemplary level shift circuit 600 in accordance with the invention. The level shift circuit 600 is similar to level shift circuit 400 but with a specific embodiment for the open-collector-output operational amplifier, and capacitors to provide stability to the feedback loop and to filter power supply noise. Specifically, the level shift circuit 600 comprises an input differential pair of bipolar transistors Q61 and Q62 having bases to respectively receive complementary signals to be level shifted and collectors respectively connected to collector resistors R61 and R62. The level shift circuit 600 further comprises output emitter-follower bipolar transistors Q63 and Q64 having bases respectively connected to the collectors of transistors Q62 and Q61, emitters respectively connected to current sources I62 and I63, and collectors coupled to the power supply rail. The shifted outputs of the level shift circuit 600 are taken off the respective emitters of transistors Q63 and Q64.

The exemplary level shift circuit 600 further comprises an open-collector-output operational amplifier comprising a p-n-p differential transistor pair Q65 and Q66 having bases to respectively receive the reference voltage and the tail voltage of the following stage, emitters respectively connected to resistors R63 and R64, and collectors respectively connected to the collectors of current-mirror transistors Q66 and Q67. The collector of the transistor Q67 is coupled to the bases of transistors Q66 and Q67 to provide the current-mirror function of the transistors. The emitters of the transistor Q66 and Q67 are respectively coupled to resistors R65 and R66. A current source I64 is provided between the power supply rail and the resistors R63 and R64 to set the currents through the differential transistor pair Q65 and Q66. The operational amplifier further includes an output transistor Q68 having a base coupled to the collector of transistors Q65 and Q66, a collector coupled to the emitters of the differential transistor pair Q61 and Q62, and an emitter coupled to ground.

In operation, the collector current through the operational-amplifier output transistor Q68 varies inversely with the difference between the reference voltage and the feedback voltage (i.e. the tail voltage of the following stage). Thus, if the feedback voltage is lower than the reference voltage (meaning that the output common-mode voltage is below the desired value), the current through the output transistor Q68 decreases, which consequently increases the common-mode voltage of the level shift circuit 600 until the feedback voltage substantially equals the feedback voltage. The opposite effect occurs if the feedback voltage is above the reference voltage. The capacitor CF and Cc provide stability to the feedback loop and filter out noise.

It will be appreciated that the peak-to-peak signal voltages developed at the collectors of Q61 and Q62, and therefore the peak-to-peak complementary signal output voltages from the circuit, are determined by current source I61 and collector resistors R61 and R62, and are therefore independent of the amount of the level shift performed by the circuit.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

It is claimed:

1. A level shift circuit to voltage shift an input common-mode voltage of input complementary signals to an output common-mode voltage of output complementary signals, comprising:
   a differential pair of bipolar transistors having bases to respectively receive said input complementary signals, emitters coupled in common to a first current source, and collectors respectively coupled to first and second resistive elements;
   a pair of emitter-follower outpct bipolar transistors having bases respectively coupled to the collectors of said differential pair of bipolar transistors, emitters respectively coupled to second and third current sources, and collectors coupled to a power supply rail, wherein said output complementary signals are respectively produced at said emitters of said emitter-follower output bipolar transistors; and a voltage drop device connected between said power supply rail and said first and second resistive elements, wherein said voltage drop device causes a voltage drop related to said voltage shift;

wherein said first current source comprises an open-collector-output operational amplifier, wherein a tail current of said first current source varies inversely with a difference between a reference voltage applied to a positive terminal of said operational amplifier and a feedback voltage applied to a negative terminal of said operational amplifier, wherein said feedback voltage is related to said output common-mode voltage.

2. The level shift circuit of claim 1, wherein said voltage drop device comprises a fourth current source.

3. The level shift circuit of claim 1, wherein said open-collector-output operational amplifier comprises:

a differential pair of p-n-p bipolar transistors having bases respectively to receive said reference voltage and said feedback voltage, emitters coupled to said power supply rail by way of respective emitter resistors and a common current source, and collectors coupled to respective current minor transistors; and an output-stage bipolar transistor having a base coupled to said collector of one of said differential pair of p-n-p bipolar transistors, a collector coupled to said emitters of said differential pair of bipolar traosistors, and an emitter coupled to a ground terminal.

4. The level shift circuit of 3, further comprising a feedback stabilizing capacitor coupled to said fourth current source and said base of said base of output-stage bipolar transistor.

5. A method of level shifting an input common-mode voltage of input complementary signals to an output common-mode voltage of output complementary signals, comprising:

performing a common-mode level shift of said input complementary signals to produce said output conaplenientary signals, wherein performing a common-mode level shift comprises;

applying said input complementary signals to bases of a differential pair of bipolar transistors, wherein said output complementary signals are derlbod from respective collectors of said differential pair of bipolar transistors; and using a voltage drop device common to said differential pair of bipolar transistors to shift said output complementary signals;

generating a feedback voltage related to said output common-mode voltage;

receiving a reference voltage; and adjusting said voltage drop device until said feedback voltage is substantially the same as said reference voltage.

6. The method of claim 5, wherein adjusting said voltage drop device comprises varying a tail current of said different of bipolar transistors inversely with a difference between said reference voltage voltage.

7. The method of claim 5, generating said feedback voltage comprises:

applying said output complementary signals to a second differential pair of bipolar transistors of a following level shift stage; and generating said feedback voltage from a tail voltage of said second differential pair of bipolar transistors.

8. The method of claim 5, wherein generating said feedback voltage comprises:

applying said output complementary signals to a second differential pair of bipolar transistors; and generating said feedback voltage from a tail voltage of said second differential pair of bipolar transistor.

9. A multi-stage level shift circuit for level shifting an input common-mode voltage of input complementary signals to an output common-mode voltage of output complementary signals, comprising a plurality common-mode level shifting stages for level shifting said input common-mode voltage to said output common-mode voltage by a plurality of respective level shifting steps, wherein each of said level shifting stages comprises;

a differential pair of bipolar transistors having bases to respectively receive input complementary signals to be shifted, emitters coupled in common to a first current source, and collectors respectively coupled to first and second resistive elements, wherein said first current source varies a tail current of said differential pair of bipolar transistors inversely with a difference between a reference voltage and a feedback voltage, wherein said feedback voltage is related to a common-mode voltage of said shifted output complementary signals;

a pair of emitter-follower output bipolar transistors having bases respectively coupled to the collectors of said differential pair of bipolar transistors, emitters respectively coupled to second and third current sources, and collectors coupled to a power supply rail, wherein said emitters of said emitter-follower output bipolar transistor serves to produce shifted output complementary signals; and a voltage drop device connected between said power supply rail and said first and second resistive elements, wherein said voltage drop device causes a voltage drop related to said voltage shift yard shifted output complementary signals.

10. The multi-stage level shift circuit of claim 9, further comprising a reference voltage circuit for generating respective reference voltage for said level shifting stages which govern the progression of said level shifting steps.

11. The multi-stage level shift circuit of claim 10, wherein said reference voltage circuit comprises:

a voltage divider comprising a plurality of series-connected resistive elements;

a Schottky diode coupled in series to the first resistive element of said voltage divider;

a first diode-connected transistor coupled across said Schottky diode and said first resistive element of said voltage divider; and a second diode-connected transistor coupled in series to the last resistive element of said voltage divider.

12. A method of level shifting an input common-mode voltage of input complementary signals to an output common-mode voltage of a output complementary signals, comprising performing a plurality of common-mode level shifts in cascadtto produce said output complementary signals from said input complementary signals, wherein performing each of said common-mode level shifts comprises:

applying received complementary signals to bases of a differential pair of bipolar transistors; and forming a voltage drop related to the amount of level shift and common to both said differential pair of bipolar transistors to form level shifted complementary signals.

13. The method of claim 12, further comprising using a feedback voltage related to a common-mode voltage of said level shifted complementary signals to control said voltage drop.

14. A method of level shifting an input common-mode voltage of input complementary signals to an output common-mode voltage of an output complementary signals, comprising;

performing a plurality of common-mode level shifts in cascade to produce said output complementary signals from said input complementary signals; and using a plurality of reference voltages to control respective plurality of common-mode level shifts.

15. The method of claim 16, wherein the progression of said plurality of reference voltages correlate with the progression of the plurality of common-mode level shifts.

* * * * *